United States Patent [19]

Tiersten et al.

[11] 4,060,777
[45] Nov. 29, 1977

[54] GUIDED ELASTIC SURFACE WAVE FILTER

[75] Inventors: Harry Frank Tiersten, Schenectady, N.Y.; Robert Chastain Smythe, Orlando, Fla.

[73] Assignee: Piezo Technology Inc., Orlando, Fla.

[21] Appl. No.: 687,901

[22] Filed: May 19, 1976

[51] Int. Cl.² .................. H03H 9/02; H03H 9/04; H03H 9/26; H03H 9/32
[52] U.S. Cl. .................. 333/72; 310/313; 310/366; 333/30 R
[58] Field of Search .......... 333/30 R, 72; 310/8.2, 310/9.8; 331/107 A; 330/5.5

[56] References Cited

U.S. PATENT DOCUMENTS

| 3,568,102 | 3/1971 | Tseng | 333/72 X |
| 3,753,164 | 8/1973 | De Vries | 333/30 R |
| 3,883,831 | 5/1975 | Williamson et al. | 333/30 R |
| 3,961,293 | 6/1976 | Hartmann et al. | 333/72 |

Primary Examiner—Harold A. Dixon
Assistant Examiner—Marvin Nussbaum
Attorney, Agent, or Firm—Darby & Darby

[57] ABSTRACT

A resonator and resonator type wave filter formed by a piezoelectric body on which acoustic surface waves are guided and reflected and in which mode coupling in a direction transverse to the surface wave propagation is utilized. The transverse modes are controlled so as to provide improved response characteristics by minimizing suppressing and/or otherwise controlling unwanted modes of vibration in the body.

25 Claims, 24 Drawing Figures

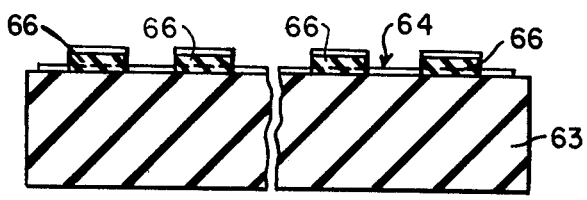
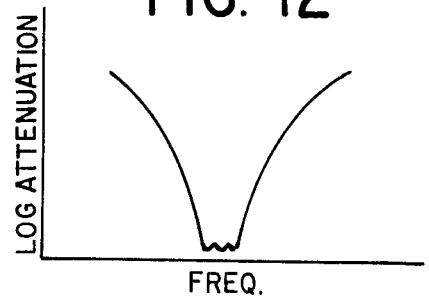
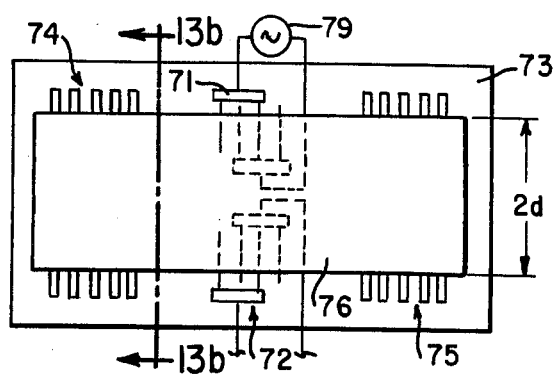
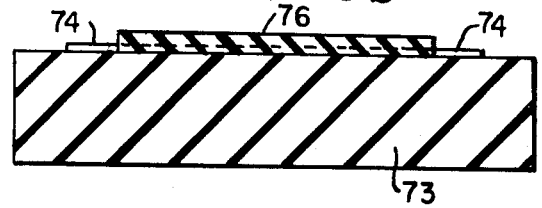
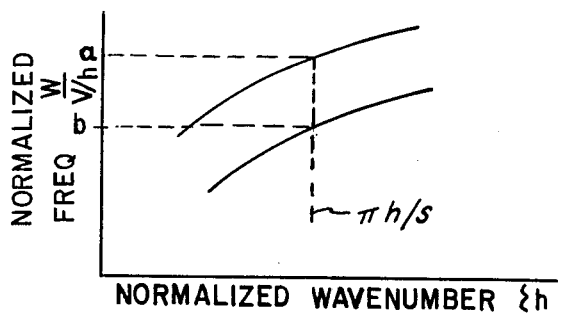
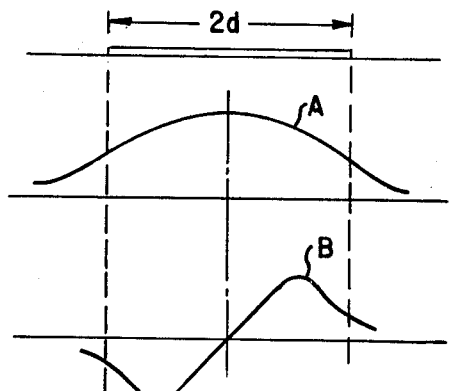
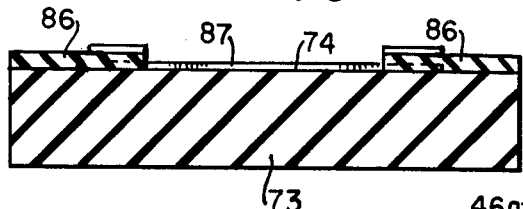
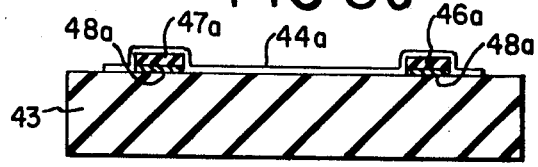
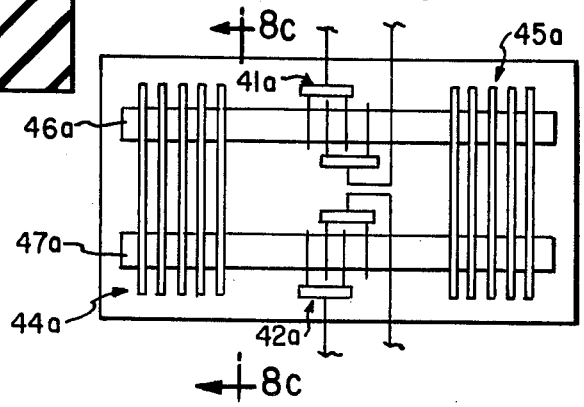

GUIDED ELASTIC SURFACE WAVE FILTER

FIELD OF INVENTION

This invention relates to an improved resonator utilizing guided elastic (acoustic) surface waves and to a wave filter employing a combination of elastic wave guidance and reflection to form resonators which are elastically coupled so as to produce a multiple pole transmission characteristic.

BACKGROUND OF PRIOR ART:

Piezoelectric resonators have been used for many years as resonant circuit elements in bandpass filter networks, such networks being commonly referred to as crystal filters. Most commonly, the piezoelectric materials employed are either crystalline quartz or piezoelectric ceramic, such as various lead zirconate-titanate materials. The resonators broadly comprise a blank of the piezoelectric material on which input and output electrodes are formed, for example by plating thin layers of an electrically conductive material. An input signal is applied to the input electrodes of the resonator which vibrates and the output signal is taken from the output electrodes, this output signal having been modified by the resonator. Quite commonly, one pair of electrodes serves both input and output functions. In such devices at frequencies above about 1 MHz the modes of vibration employed are almost invariably thickness modes such as thickness-shear or thickness-extension. Such resonators are generally characterized as bulk wave resonators.

In the theory of electric wave filters, it is well known that two or more resonators coupled in tandem fashion, with the first and last resonator being in addition coupled to, respectively, a source (or generator) and a load (or detector) constitute a bandpass filter, the bandwidth being determined by the degree of coupling. The use of electrical coupling between individual resonators or a plurality of resonators may require numerous interconnections and additional circuit elements including inductive devices such as balanced transformers. During recent years, elastically-coupled (acoustically coupled) thickness-shear resonators have been used to form multi-resonator bandpass filters which eliminate many of these circuit elements and connections. Such multi-resonator structures are commonly called monolithic crystal filters. They are described, for example, in an article in *Electronics*, vol. 45, No. 3, pages 48–51, dated Jan. 31, 1972, written by R. C. Smythe. In general, in structures of this type the coupling between adjacent resonators on a common piezoelectric plate occurs due to a trapping effect under the electrodes, the latter normally being of the plated type.

Monolithic crystal filters have found wide application, being simpler, smaller, and less costly than conventional crystal filters. However, serious limitations on the maximum bandwidth and center frequency which may be obtained in practice with monolithic crystal filters arise due to the fact that at high frequencies the piezoelectric plate constituting the main body of the filter becomes extremely thin and fragile. By using overtones of the fundamental thickness modes, a thicker plate may be used, but this in turn imposes severe limitations on the maximum bandwidth.

A variety of piezoelectric filter devices employing elastic surface waves recently have been devised for various signal processing applications at frequencies from roughly 30 MHz to above 1 gHz. Among these are a number of bandpass filter structures which achieve their response characteristic by frequency dependent interference effects rather than by use of resonance effects. For example, a pair of interdigital transducers is frequently used as a bandpass filter. In such structures the filter bandwidth is generally inversely proportional to the length of one or both transducers. This gives rise to a disadvantage in that in order to achieve narrow bandwidths the length of one or both transducers may be excessive. Moreover, special structures such as unidirectional transducers are required if the insertion loss of these filters is to be low. In this case the size and complexity of the structure are further increased.

More recently, elastic surface wave resonators have been described which functionally resemble bulk wave resonators such as the piezoelectric thickness-shear resonators previously mentioned. Because of their high Q and, for suitable materials, good temperature stability, such resonators may be used as circuit elements in bandpass filters in the same manner as individual bulk wave resonators were used prior to the development of the monolithic crystal filter. Such resonators were first described by E. A. Ash in a paper titled "Surface Wave Grating Reflectors and Resonators" presented at the 1970 International Microwave Symposium in Newport Beach, Calif., May 11–14, 1970, an abstract of which appears in the Digest of the IEEE Symposium on Microwave Theory and Techniques, 1970, p. 385. In this presentation Ash described the basic idea of using grating type reflecting structures to form high Q surface resonators, presented a partial theory of operation and gave preliminary experimental results. However, the work of Ash did not take into account the transverse mode structure of the resonator, recognition and control of which is of great importance in suppressing unwanted resonances in the resonator response characteristic. Further, Ash did not suggest methods and configurations for achieving elastic coupling between resonators either in the longitudinal direction of the resonator or in the transverse direction in order to construct a bandpass filter in which electrical coupling is unnecessary, or for some other purpose.

Following the work of Ash, C. S. Hartman and R. C. Rosenfield in U.S. Pat. No. 3,886,504 have described resonators which are essentially identical to Ash's and also the use of electrical coupling between two or more surface wave resonators in order to produce improved frequency selective characteristics. In addition, the patent teaches one form of elastic coupling in the longitudinal direction of the resonators. However, the patent does not recognize the existence of transverse modes and does not take into account the transverse mode structure in determining the response characteristic of a resonator or in its effect on elastic coupling between resonators. In addition the patent does not suggest any form of transverse elastic coupling between resonators.

SUMMARY OF THE INVENTION

The present invention relates to a surface wave device formed on a piezoelectric body in which there is a single resonator or a plurality of resonators with coupling between resonators formed on the body in the longitudinal direction of the resonators. In addition, the transverse mode structure of the device is controlled so as to produce an improved individual resonator response characteristic and so as to provide elastic coupling between resonators in the transverse direction and improved characteristics for elastic coupling in the longitudinal direction.

Control of the transverse mode structure is obtained by controlling the mass loading of reflector and transducer elements of the structure and/or by the use of coupling means. The coupling means itself can comprise elements which are themselves acoustically coupled.

The control of the transverse modes in the resonators according to the invention provides improved response characteristics by minimizing, suppressing and/or otherwise controlling unwanted modes of vibration. Said coupled resonator devices may be coupled either transversely or longitudinally and may be used either singly or electrically interconnected with other resonators or coupled resonator devices.

OBJECTS OF THE INVENTION

It is therefore an object of the invention to provide a piezoelectric resonator using surface waves in which the transverse mode structure is utilized and controlled.

Another object is to provide a new and improved bandpass filter using surface waves.

A further object is to provide an improved individual resonator.

An additional object is to provide a new and improved surface acoustic wave bandpass filter using elastic (acoustic) coupling.

A further object is to provide a piezoelectric surface wave resonator in which improved response characteristics are obtained by minimizing, suppressing or otherwise controlling unwanted modes of vibration.

Yet another object is to provide a new and improved surface acoustic wave bandpass filter using improved surface wave resonators which are elastically coupled.

Still a further object is to provide a new and improved surface acoustic wave bandpass filter using improved surface wave resonators which are elastically coupled in a direction transverse to the direction of wave propagation or in the direction of wave propagation and which take into account the mode structure in the transverse direction.

An additional object of the invention is to provide a surface acoustic wave bandpass filter using wave guidance principles.

Other objects and advantages of the present invention will become more apparent upon reference to the following specifications and drawings in which:

FIGURE SUMMARY

FIG. 1 is a schematic diagram of an acoustic surface wave resonator;

FIGS. 2a and 2b respectively are diagrams showing respectively the resonator resonance curve for the case of excessive trapping and optimum trapping, the former representing a typical prior art resonator;

Figure 8A:
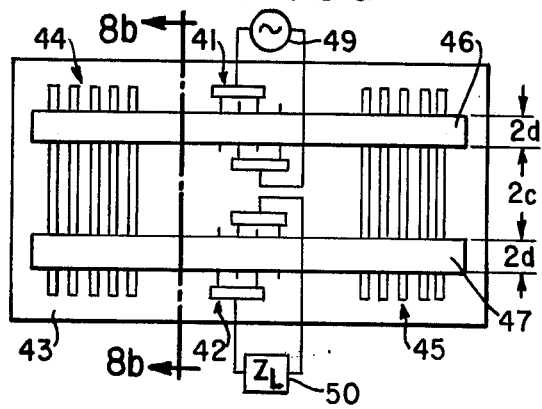
Figure 8B:
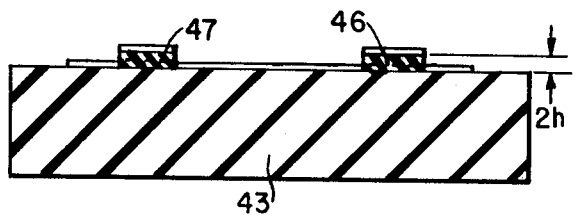
Figure 9:
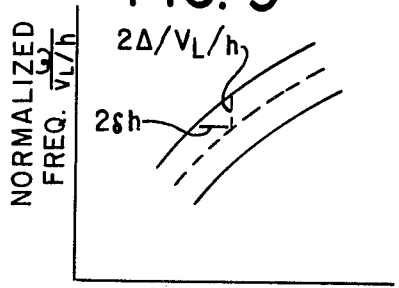
Figure 10:
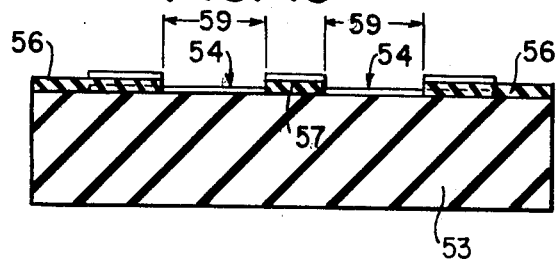
Figure 11A:
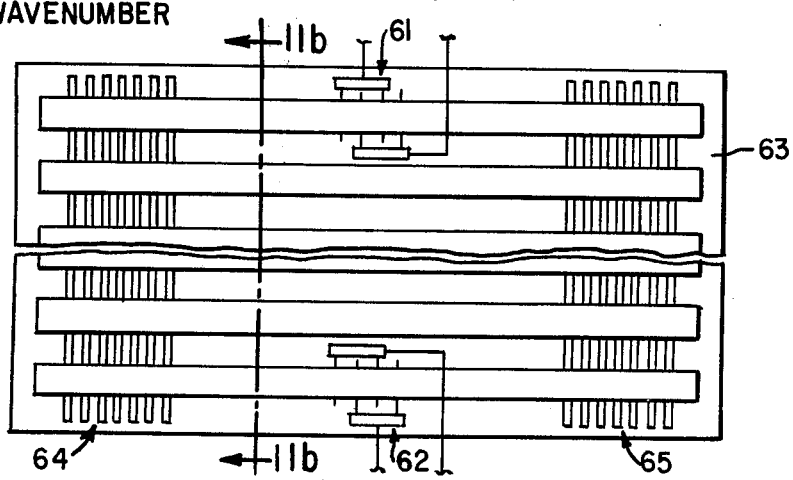

FIGS. 8a and 8b respectively are top and cross-sectional views of a second embodiment of the invention in which two resonators are elastically coupled in the transverse direction using parallel coupling strips and FIGS. 8c and 8d are top and cross-sectional views of a modification of the device of FIGS. 8a and 8b;

FIG. 9 is a graph showing the dispersion curves for the structure of FIGS. 8a and 8b;

FIG. 10 is a cross-sectional view of a modification of the embodiment of FIG. 8 using parallel coupling slots instead of strips;

FIGS. 11a and 11b respectively are top and cross-sectional views of another modification of the embodiment of FIG. 8 having more than two resonators;

FIG. 12 is a graph showing the response characteristic of the embodiment of FIG., 11 when operated between suitable input and output impedence terminations;

FIGS. 13a and 13b respectively are top and cross-sectional views of a third embodiment of the invention using a single coupling strip;

FIG. 14 is a graph showing the fundamental symmetric and anti-symmetric modes of the embodiment of FIG. 13;

FIG. 15 is a graph showing the dispersion curves for the fundamental modes of the structure of FIG. 13; and FIG. 16 is a cross-sectional view of a further embodiment of the invention.

Figure 1:
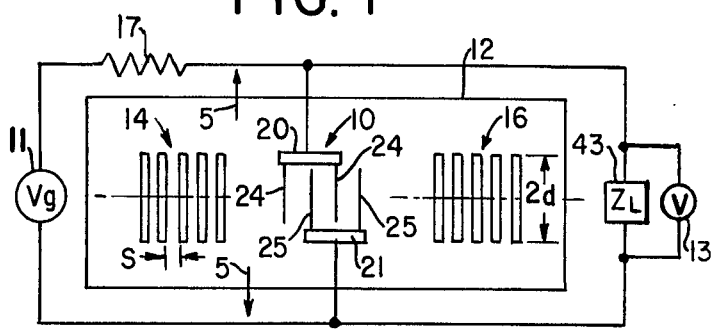

FIG. 1 is a schematic diagram which visually resembles an acoustic surface wave resonator such as described by Ash but which illustrates the principles of the subject invention. The device includes an interdigital transducer 10 having separated electrodes 20 and 21 with respective interleaved fingers 24 and 25. The electrodes 20 and 21 are connected through a resistor 17 to a source of energy 11 (Vg) of a suitable frequency and to a detector 13 such as a voltmeter placed across the transducer output $Z_L$. In an appropriate situation, the detector itself can form the transducer load. The transducer 10 is located between two sets of reflecting strips 14 and 16. The transducer 10 and sets of strips 14 and 16 are laid down, such as by plating on a body of piezoelectric material, for example lithium niobate or quartz. The plating can be accomplished by conventional vacuum deposition, photoetching and photoresist masking or other techniques and the electrodes 20 and 21 can be of aluminum or other electrically conductive material. The reflecting strips 14 and 16 may be of the same material as the electrodes or may be of a different material which may be electrically conductive or nonconductive. In the prior art, reflectors are formed without plating by photolithographically etching guides in the piezoelectric body 12 and by locally altering the physical properties of body 12 in a periodic manner, such as by ion implantation.

The fingers 24 of electrode 20 and the fingers 25 of electrode 21 each have a width typically of several microns and a pair of fingers, for example 24, are spaced apart by one wavelength at the operating frequency so that two fingers 24 and 25 are approximately one-half wavelength apart. The sets of strips 14, 16 are located several wavelengths or more from the transducer 10, the distance preferably being chosen as small as practical and such that at the resonance frequency the acoustic wavelength is equal to twice the distance, designated by the letter s, by which the strips of each set are spaced apart. The normals to the face of the piezoelectric body 12, the transducer 10, and the reflectors 14 and 16 are all oriented in a defined manner with respect to the crystallographic axes of the piezoelectric body 12 in accordance with well-known art.

In operation, as described in the prior art, the transducer interacts with the piezoelectric body 12 to produce two surface acoustic waves travelling in opposite directions at right angles from the fingers 24, 25 of the transducer 10. Each travelling wave is successively attenuated as it passes under the strips of the respective sets 14, 16 by a reflecting action. This is described in the aforesaid Hartman and Rosenfield patent.

At the resonance frequency of the device, a standing wave exists between the reflector strips 14, 16 in the longitudinal direction (transverse to the fingers 24, 25). The standing wave is trapped or largely confined in the transverse direction, shown by the arrows 5, by the wave guiding action of the reflectors 14, 16 and, to a degree, by the transducer 10. Each of the fingers 24, 25 has a length $2d$ and is placed so as to have a maximum interaction with the standing wave.

If the trapping in the transverse direction is excessive, more than one resonance may exist. The resonance lowest in frequency is the fundamental symmetric mode. The next higher mode is the fundamental antisymmetric mode. Successively higher modes are alternately symmetric and antisymmetric with respect to the longitudinal center line of the resonator structure. However, if the excitation provided is symmetric, which is the usual case, only the symmetric modes will be observable at the transducer terminals, here shown by the output $Z_L$ across which a voltage V can be measured.

Figure 2A:
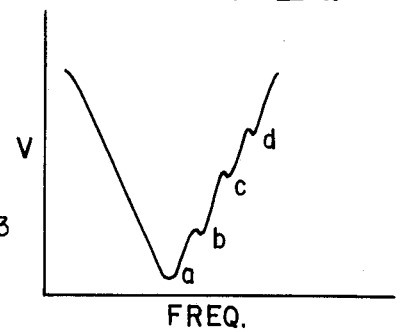

The resonance curve of a resonator having excessive trapping in the transverse direction is shown in FIG. 2a, in which the principle resonance, or fundamental symmetric mode is designated by the letter $a$, while $b$, $c$ and $d$ are higher order resonances or modes, specifically the second, third and fourth symmetric modes, respectively. The resonance curve shows the attenuation of the device at various frequencies. The resonance curve of the device of FIG. 1 is measured by varying the frequency of the energy from source 11 with the voltage V across the transducer terminals being measured by detector 13. Alternatively an output voltage may be taken from another interdigital transducer (not shown).

Figure 3A:
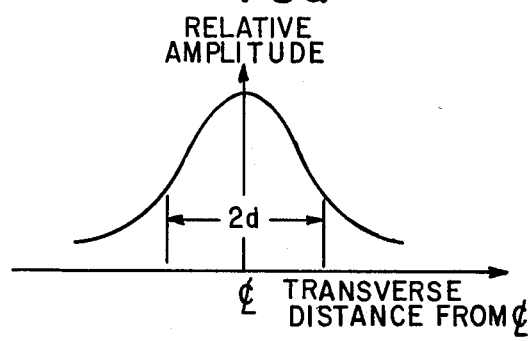
FIGS. 3a and 3b are diagrams showing respectively typical fundamental and third symmetric transverse mode shapes for the resonator.
Figure 3B:
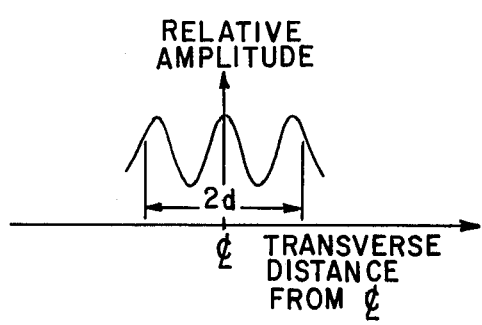

The shape of the fundamental symmetric mode of the standing wave in the transverse direction is shown in FIG. 3a. This corresponds to the resonance point $a$ of FIG. 2a. FIG. 3b shows the shape of the second symmetric mode, which corresponds to resonance point $b$ of FIG. 2a. The fundamental antisymmetric mode whose frequency is between those of the fundamental and second symmetric modes, $a$ and $b$ is not electrically excited, nor are the second and third antisymmetric modes lying between the second or third symmetric modes and third and fourth symmetric modes, respectively.

Figure 2B:
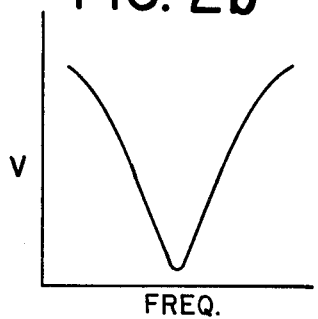

By properly dimensioning the resonator the number of transverse modes which are trapped and their frequency spacing may be controlled. Specifically by controlling the width ($d'$) and/or the thickness ($h$) and/or the mass (sometimes called plateback) of the reflecting strips and by suitable choice of material it is possible to trap only the fundamental symmetric transverse mode or the fundamental symmetric and antisymmetric transverse modes. Control of the same parameters for the transducer fingers also has an effect on the transverse mode trapping. When only the fundamental symmetric or the fundamental symmetric and antisymmetric transverse modes are trapped, the structure will produce the resonance curve of FIG. 2b. Increasing any or all of these parameters, that is, the width of the strips 14, 16 and the fingers 24, 25 and/or their mass causes successively higher order transverse modes to be trapped. Recognition of this relationship is an aspect of the invention which is applicable to both the individual resonator of FIG. 1 and to elastically coupled resonator structures in general. Thus, the device of FIG. 1 illustrates a basic principle of the invention in controlling, minimizing and suppressing the unwanted transverse modes of vibration.

Figure 4:
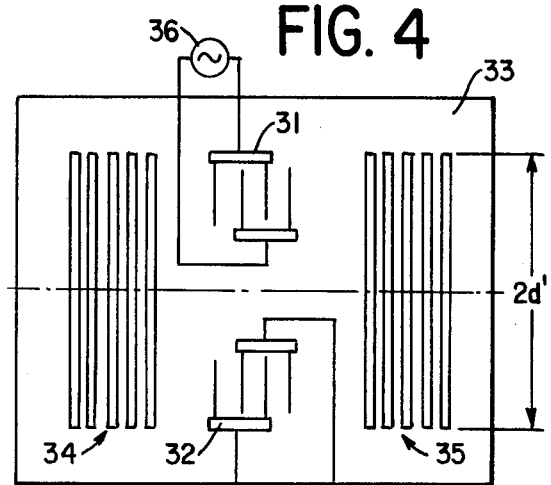
FIG. 4 is a simple embodiment of the transverse coupled acoustic surface wave resonator filter of the present invention showing two resonators so coupled.

FIG. 4 shows a filter structure made in accordance with the subject invention. Here, two interdigital transducers 31 and 32 are placed on a piezoelectric substrate 33 between two arrays of reflecting strips 34 and 35. The strips have a length of $2d'$, or $d'$ on each side of the center line of the arrays. A source of energy 36 is connected to one transducer, for example 31, which is the input of the device and a load 38 connected to the other transducer 32, which is the device output. In this embodiment by properly selecting the parameters discussed above both the symmetric and antisymmetric fundamental transverse modes may be excited more or less equally. Moreover by properly dimensioning the parameters of the structure, the frequency separation between the fundamental symmetric and antisymmetric mode frequencies may be controlled.

Figure 5A:
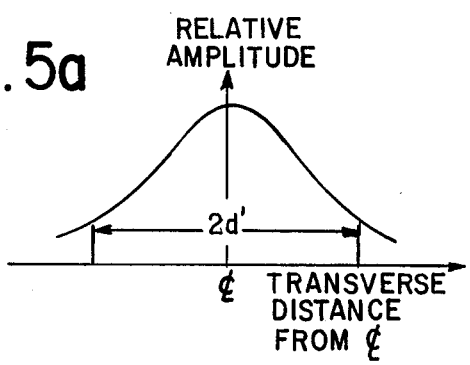
FIGS. 5a and 5b are diagrams showing the fundamental transverse mode shapes for the structure of FIG. 4.
Figure 5B:
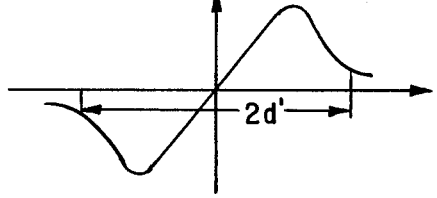

FIG. 5a shows the shape (amplitude) of the fundamental symmetric transverse mode while FIG. 5b shows the fundamental antisymmetric mode, both as a function of the distance from the center line of the piezoelectric body.

Figure 6:
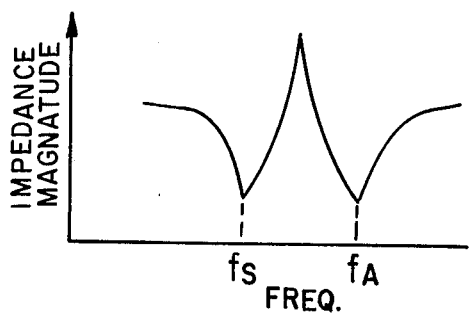
FIG. 6 is a diagram representing the magnitude of the short circuit impedance of the structure versus frequency showing the fundamental mode frequencies.
Figure 7:
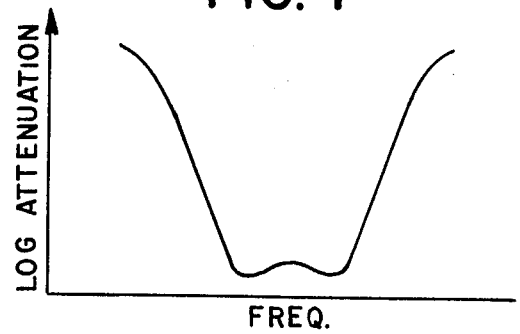
FIG. 7 is a graph showing a typical attenuation characteristic for the structure.

FIG. 6 shows the magnitude of the impedance seen at one transducer of the device of FIG. 4 with the other transducer short circuited. Here $f_s$ and $f_A$ are approximately the resonant frequencies of the symmetric and antisymmetric modes, respectively. FIG. 7 shows the attenuation versus frequency response when one transducer is connected to the generator or driving circuit 36 and the other transducer is connected to the detecting or load circuit 38. The magnitude of the attenuation variation, or ripple, in the passband region, is determined by the impedances in the driving and detecting circuitry in accordance with standard filter art. As seen the device has filter passband characteristics.

Qualitatively, the operation of the filter device can be explained either in terms of the trapping of the symmetric and antisymmetric transverse modes described or in terms of coupled circuit theory. From the former viewpoint, at the driving frequency of the generator the wavelength of each mode differs, but both modes are reflected by the arrays 34, 35 with whose reflection characteristics depend on the wavelength. Thus the reflection of each mode will have different frequency characteristics, causing the detecting circuit, which responds to the sum of the two modes, to produce the response shown in FIG. 7. The magnitude of the ripple is determined by the impedances in the external circuitry and operation at low ripple may require the use of shunt inductors to absorb excess shunt capacitance of the transducer electrodes in some cases in accordance with standard filter art.

From the coupled circuit viewpoint the modes of the filter can be considered the result of coupling together two circuit, each resonant at the same frequency. The spacing of the symmetric and antisymmetric modes of the filter (FIG. 6) is determined by the degree of coupling. The filter response characteristic (FIG. 7) is then dependent upon the coupling and the impedances in the external circuitry. In either case the response of the device is that of a two-pole filter with a passband principally controllable by the width $2d'$, the thickness $2h$, and the mass of the reflectors and by the parameters of the reflectors. These parameters control both the longitudinal guiding of the surface waves and the transverse standing wave modes.

As explained previously, the transverse modes also can be controlled, or guided, by varying certain parameters such as the spacing of the strips of the reflecting arrays, and changing their widths and thicknesses (mass loading). In accordance with one embodiment of the invention each strip in the reflecting array is electrically conductive, and the strips are not electrically connected and hence are unshorted. In this case the guided modes are electrically as well as elastically coupled. Electrical coupling is produced because the unconnected strips are at different potentials. In another embodiment each strip in the reflecting array is electrically conductive and the strips are electrically connected and hence are shorted. In a third embodiment each strip in the reflecting array is electrically nonconducting. In the latter two cases the guided transverse modes are caused purely acoustically. In operation the driving transducer excites, at the driving frequency, a number of guided transverse modes of any one of the composite structures. By selectively confining oneself to a narrow enough frequency range, one can effectively utilize any two adjacent (in frequency) guided modes. Most conveniently, these may be the fundamental symmetric and antisymmetric transverse modes. The separation in frequency between any two adjacent (in frequency) resonant modes may be determined from the frequency-wavenumber dispersion relations for the particular modes used.

The embodiment shown schematically in FIG. 4 is presently believed to be the simplest embodiment of filter which can be constructed in accordance with the present invention. However, the embodiment of FIG. 4 is not to be considered as limiting of the filters which can be constructed in accordance with the invention. Other embodiments are described below which may afford improved control of coupling and hence of bandwidth, improved control of unwanted modes and of Q and greater freedom in selecting impedance levels.

In the various embodiments of the invention there may or may not be additional interdigital transducers beyond or instead of the two transducers illustratively shown in FIG. 4 either to aid in fabrication or to increase the number of ports for some preferred device application, which does or does not utilize quided modes, other than or in addition to the fundamental symmetric and antisymmetric modes. This should be borne in mind when considering the embodiments described below.

The coupled resonator type device of the subject invention for example as in FIG. 4, can be coupled either transversely or longitudinally. They can be used either singly or electrically interconnected with other resonators or coupled resonator devices.

As described below, there can be transverse acoustic coupling to produce two-resonator (two-pole) and multi-resonator (multi-pole) surface wave devices and, in particular, two resonator and multi-resonator devices which can function as bandpass filters.

FIGS. 8a and 8b show another embodiment of the invention. Here, two interdigital transducers 41 and 42 are formed on the piezoelectric substrate 43, between two arrays of reflecting strips 44 and 45. The strips 44 and 45 are also located on the substrate. As described previously, the strips of the arrays 44 and 45 can be of conductive or non-conductive material. In the former case that can be electrically connected or insulated from each other.

Both the arrays 44 and 45 of reflecting strips and the interdigital transducers 41 and 42 are partially overlaid by two continuous, substantially identical thin coupling strips 46 and 47 of insulating material deposited on the surface of the piezoelectric substrate, as shown in the cross-section in FIG. 8b. Strips 46 and 47 are each preferably of uniform thickness so that they ride over the transducers and the arrays. As described below in connection with FIGS. 8c and 8d, the strips 46, 47 also can be under the strips of the arrays and transducers. The coupling strips can be of any suitable material, for example $SiO_2$, $ZnO$, $Si_1N_4$ or other similar, suitable materials. The strips 46, 47 can be placed on the substrate by any suitable technique, for example, plating, deposition, etc. The coupling strips 46 and 47 are acoustically coupled so as to form surface wave resonators coupled by the two parallel thin strips. The material of strips 46 and 47 must be such that the straight-crested surface wave velocity in the coupling strips is lower than in the unplated region. This is accomplished by suitably choosing the material of coupling strips 46 and 47. Interdigital transducer 41 is connected to driving circuit 49 and the other transducer 42 to a detecting or load circuit 50.

As in the case of the embodiment of FIG. 4, the fundamental symmetric and antisymmetric modes of the transverse standing wave with respect to the centerline between the two coupling strip guide structures 46, 47 are utilized. In this instance, these modes are composed of modes corresponding to the fundamental symmetric mode of the single guide structure which is discussed in a publication entitled "Elastic Surface Waves Guided by Thin Films", by H. F. Tiersten, J. Appl. Phys., February 1969, pp. 770–789. The frequencywavenumber dispersion curves for the fundamental mode of the single guide structure and the fundamental symmetric and antisymmetric modes of the coupled two guide structure are shown in FIG. 9. At a given resonant wavelength determined by the spacing of the strips with respect to the reflector arrays and the spacing of the arrays, the separation in frequency between the fundamental symmetric and antisymmetric modes of the fundamental two guide structure is given by $$\omega_a - \omega_s = 2k\eta \overline{B}^2 \cos^2\eta d \, e^{-2\overline{\eta}c/\omega}, \tag{1}$$

where $$\overline{B} = [m\eta^{-1}\cos^2\overline{\eta}d + \overline{m}(2\overline{\eta})^{-1}(2\overline{\eta}d + \sin 2\overline{\eta}d)]^{-\frac{1}{2}}, \tag{2}$$

$\omega$, $\omega_A$ and $\omega_s$ are the circular frequencies of the fundamentalmode of the single guide structure and the fundamental antisymmetric and symmetric modes of the coupled two guide structure, respectively, and $m(\overline{m})$ and $k$ are defined in Eqs. (6.5), respectively, of the above mentioned publication by Tiersten. The quantities $\eta$ and $\overline{\eta}$, which determine the shape of the mode function in the unplated and plated regions, respectively, are given by:

$$\eta = \frac{2\pi}{\lambda}\left[\frac{V_s^2 - V^2}{V_s^2}\right]^{\frac{1}{2}}, \overline{\eta} = \frac{2\pi}{\lambda}\left[\frac{V^2 - \overline{V}_s^2}{\overline{V}_s^2}\right]^{\frac{1}{2}} \quad (3)$$

where λ is the wavelength and V is the phase velocity of the variablecrested fundamental surface wave mode of the single guide structure, which at resonance is equal to twice the spacing of the reflectors s, i.e., λ = 2s, and $V_s$ and $\overline{V}_s$, are the phase velocities of straight-crested surface waves in the unplated and plated regions, respectively. The constants c and d are geometric quantities defined in FIG. 8. That is, c is the distance from the substrate center line to the nearest edge of a strip and d is one half the width of a strip.

In FIGS. 8a and 8b the guide, or coupling, strips 46, 47 are laid over the transducers and the arrays of reflecting strips. It should be understood that the strips can lie under these elements. This is shown in FIGS. 8c and 8d where the various corresponding elements have been designated by the "a" suffix. It should be understood that the drawing of FIGS. 8c and 8d is greatly exaggerated (as is the drawing of FIGS. 8a-and 8b) in the sense that the thickness of the coupling strips 46a, 47a is in the order or microns as is the thickness of the transducers and strips of the reflecting arrays. The structures of FIGS. 8a-8b and 8c-8d are of the type first referred to above in which each strip of the reflecting array is electrically conductive but not electrically connected. Therefore, the transverse mode coupling is part acoustic and part electric.

FIG. 10 is a cross-section of a structure which is a modification of the embodiment shown in FIG. 8. Here, both the interdigital transducers 51 and 52 and the arrays of reflecting strips 54 and 55 are laid down on the piezoelectric substrate 53. As in the case of FIG. 8, the transducers and strips of the reflecting arrays are partially overlaid or underlaid by parallel guide or coupling strips of thin films of insulating material 56 and 57. Here, there is a strip 56 on each edge of the structure and a strip 57 in the center. The strips 56 on the edges are deposited so as to leave two identical slots 59 between them and the center strip 57 which extend the length of the strips. In the slot case the plating material 56, 57 for the strips must be such that the straight-crested surface wave velocity in the plated region is higher than in the unplated region. The remainder of the above discussion in the strip guided embodiment of FIG. 8 applies without essential change in the slot guide case. If desired, the strips 56 and 57 may be over-plated wholly or in part with electrically conductive material.

FIG. 11 shows an embodiment of filter using a multicoupling strip arrangement. Here, two interdigital transducers 61 and 62 are placed on a piezoelectric substrate 63, between two arrays of reflecting strips 64 and 65. Both the reflecting arrays 64, 65 and the interdigital transducers 61, 62 are partially overlaid or underlaid by a number of thin, parallel strips of insulating material 66 deposited on the surface of the piezoelectric substrate 63 as shown in the cross-section of FIG. 11b.

The operation of the embodiment of FIG. 11 is much the same as in the above disclosed embodiments of FIGS. 8 and 10. Here, however, the response is that of a filter having more than two poles, as shown in FIG. 12. This extension of the two-pole device to a multipole device applies in the slot guide as well as the strip guide case. That is, some or all of the strips 66 of FIG. 11 can be slotted and plated in the same manner as FIG. 10. In either case there also can be additional interdigital transducers (not shown) beyond or instead of the two shown in FIG. 11 either to aid in fabrication or to increase the number of ports for some preferred device application. As described previously, the strips 66 can be laid under the interdigital transducers and reflecting arrays.

FIG. 13 shows two interdigital transducers 71 and 72 placed on a piezoelectric substrate 73, between two arrays of reflecting strips 74, 75. Both the reflecting arrays 74, 75 and the interdigital transducers 71, 72 are partially overlaid or underlaid by a single thin strip of insulating material 76 deposited on the surface of the piezoelectric substrate 73, as shown in the cross-section in FIG. 13b.

In the embodiment of FIG. 13, the relationship of the insulating strip material 76 to the rest of the substrate 73 must be such that the straight-crested surface wave velocity in the plated region 76 is lower than in the unplated region 73. In operation, the driving transducer 79 excites, at the driving frequency, both the fundamental symmetric and antisymmetric modes of the single guide structure, which are shown in FIG. 14. The fundamental symmetric mode of the single guide structure is discussed in the embodiment of FIG. 4 and both the fundamental symmetric mode and the fundamental antisymmetric mode are analytically discussed in the publication by Tiersten mentioned in connection with that embodiment. The frequency wave number dispersion curves for the fundamental symmetric and antisymmetric modes of the single guide structure obtained from the results of the above reference are shown in FIG. 15. At a given resonant wavelength determined by the spacing of the strips of the reflector arrays 74, 75, the separation in frequency between the two abovementioned modes is determined by the vertical distance a–b between the two dispersion curves shown in FIG. 15 at the vertical line πh/s, which is the resonant wavenumber, and must be found numerically. The operation and response of this third embodiment of the device will be similar to that of the embodiment of FIG. 8. Consequently, the response of this embodiment of the device will be as shown in FIG. 7.

The embodiment of FIG. 13 can be further modified, if desired, by plating strips of electrically conductive material along each edge of the insulating strip 76. The conductive strips would be spaced from each other and leave an open central area. The effect of the conductive strips was discussed previously. The modification would be similar to that of FIG. 8b with the central area being occupied by the non-conductive strip.

FIG. 16 is a cross-section of a device which is a modification of the embodiment of FIG. 13. Herein both the reflecting arrays 74, 75 and the interdigital transducers 71, 72, as shown in FIG. 13 are partially overplated or underplated at the side edges of the substrate 73 with a thin film of insulating material 86 deposited on the substrate so as to produce a single slot 87 as shown in the cross-section in FIG. 16. Again, in the slot case the relationship of the plated to unplated areas of the strip 86 must be such that the straight-crested surface wave velocity in the plated region is higher than in the unplated region. The remainder of the above discussion in the single strip guided embodiment of FIG. 14 applies without essential change in the single slot guide case. If desired, conductive strips can be plated over insulating strips 86.

In either of the above embodiments of FIGS. 14 or 16 there may or may not be additional interdigital transducers beyond or instead of the two shown in FIG. 13 either to aid in fabrication of to increase the number of ports for some preferred device application, which does or does not utilize guided modes other than or in addition to the fundamental symmetric and antisymmetric.

In addition to the transverse coupled filter structures previously described, the concept of control of the transverse mode structure can be equally well applied to a longitudinal coupled structure (such as that of Hartman and Rosenfeld, FIG. 1) thereby providing improved control of unwanted filter responses and of elastic coupling.

What is claimed is:

1. A surface wave resonator device comprising:
    substrate means having at least a surface layer of piezoelectric material,
    acoustic surface wave transducer means disposed on said piezoelectric surface of said substrate means operable in response to an input electrical signal to produce propagation of acoustic surface waves on said piezoelectric surface of said substrate means in a first direction,
    means forming first and second arrays of elements on the piezoelectric surface of said substrate means on opposite sides of said acoustic surface wave transducer means and being multiply reflective to the acoustic surface waves propagated by the transducer means to produce by energy trapping at least one region on the piezoelectric surface of said substrate means wherein a first acoustic standing wave resonance occurs which is generally in said first direction and a second acoustic standing wave resonance occurs in a second direction which is generally transverse to said first direction, and
    means for controlling at least one characteristic of the second acoustic standing wave.

2. A surface wave resonator device as in claim 1 wherein said controlling means comprises the mass loading of the elements of at least one of the reflective arrays.

3. A surface wave resonator device as in claim 2 wherein said elements of said reflective array comprise strips of electrically conductive material.

4. A surface wave resonator device as in claim 3 wherein said mass loading is dependent on the thickness of said strips.

5. A surface wave resonator device as in claim 1 wherein said controlling means controls said second standing acoustic wave to have substantially only a fundamental symmetric mode.

6. A surface wave resonator device as in claim 1 wherein said controlling means controls said second standing acoustic wave to have substantially only a fundamental symmetric and a fundamental antisymmetric mode.

7. A surface wave resonator device as in claim 1 wherein said transducer means comprises first and second transducers, one for receiving the input electrical signal and the other having a load connected thereto for receiving an output signal produced by the device.

8. A surface wave resonator device as in claim 7 wherein both said first and second transducers and the elements of the arrays lie across the center line of the substrate and are substantially transverse thereto.

9. A surface wave resonator device as in claim 7 wherein the elements or the arrays lie across the center line of the substrate means and substantially transverse thereto, one of said first and second transducers being on each side of said center line.

10. A surface wave resonator device as in claim 1 wherein said controlling means comprises coupling means on said substrate for providing coupling between two fundamental modes of said second standing acoustic wave which are respectively symmetric and antisymmetric in said second direction.

11. A surface wave resonator device as in claim 10 wherein said coupling means comprises at least one strip means of electrically insulating material on said substrate spanning the distance between at least some of the elements of both arrays.

12. A surface wave resonator device as in claim 11 wherein said strip means overlies at least some of the elements of said arrays.

13. A surface wave resonator device as in claim 11 wherein said strip means underlies at least some of the elements of said arrays.

14. A surface wave resonator device as in claim 11 wherein said strip means comprises only one said strip of electrically insulating material.

15. A surface wave resonator device as in claim 11 wherein said strip means comprise at least one pair of strips spaced apart on said substrate in an acoustically coupled relationship.

16. A surface wave resonator device as in claim 13 wherein said strip means comprise at least one pair of strips spaced apart on said substrate in an acoustically coupled relationship.

17. A surface wave resonator device as in claim 15 wherein there are a multiplicity of said strips greater than two located on said substrate in a generally parallel relationship, adjacent strips being in an acoustically coupled relationship.

18. A surface wave resonator device as in claim 15 wherein said strip means comprise a single pair of said strips spaced apart on said substrate in an acoustically coupled relationship.

19. A surface wave resonator device as in claim 10 wherein said coupling means comprises at least one slot means on said substrate spanning the distance between at least some of the elements of both arrays, said slot means formed by a pair of parallel slot means of electrically insulating material on said substrate.

20. A surface wave resonator device as in claim 19 further comprising electrically conductive means on the face of the said pair of strips.

21. A surface wave resonator device as in claim 19 wherein there is a further strip of electrically insulating material between said pair of strips.

22. A surface wave resonator device as in claim 21 further comprising electrically conductive means adjacent a face of said further strip.

23. A surface wave resonator device as in claim 19 wherein each strip of the pair of strips is adjacent a respective parallel edge of the substrate.

24. A surface wave resonator device as in claim 1 wherein said first direction lies along the longitudinal axis of the substrate means and said second direction is substantially transverse to said first direction.

25. A surface wave resonator device as in claim 1 wherein said first direction lies along the longitudinal axis of the substrate means amd said second direction is substantially transverse to said first direction, said controlling means comprising coupling means in the form of a strip of material extending in said first direction and spanning the distance between at least some of the elements of both arrays to provide coupling.

* * * * *